(12) United States Patent
Kozhukh

(10) Patent No.: US 6,937,320 B2
(45) Date of Patent: Aug. 30, 2005

(54) REFLECTIVE LIQUID CRYSTAL DISPLAY LITHOGRAPHY SYSTEM

(75) Inventor: Michael Kozhukh, Palo Alto, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/718,828

(22) Filed: Nov. 21, 2003

(65) Prior Publication Data

US 2004/0114118 A1 Jun. 17, 2004

Related U.S. Application Data

(62) Division of application No. 10/057,706, filed on Jan. 24, 2002.

(51) Int. Cl.[7] ......................... G03B 27/32; G03B 27/42; G03B 27/54
(52) U.S. Cl. ............................... 355/77; 355/53; 355/67
(58) Field of Search .................... 355/53, 67, 71, 355/77; 359/290–292; 430/22

(56) References Cited

U.S. PATENT DOCUMENTS

| 4,653,860 A | 3/1987 | Hendrix |
| 4,924,257 A | 5/1990 | Jain |
| 5,045,419 A | 9/1991 | Okumura |
| 5,138,368 A | 8/1992 | Kahn et al. |
| 5,691,541 A | 11/1997 | Ceglio et al. |
| 5,870,176 A | 2/1999 | Sweatt et al. |
| 6,215,578 B1 * | 4/2001 | Lin ............................ 359/292 |
| 6,238,852 B1 | 5/2001 | Klosner |
| 6,544,698 B1 * | 4/2003 | Fries ........................... 430/22 |
| 6,624,880 B2 * | 9/2003 | Sandström et al. ........... 355/71 |
| 2002/0171816 A1 * | 11/2002 | Markle ........................ 355/67 |

OTHER PUBLICATIONS

E.C. Colgan et al., "On–chip Metallization Layer for Reflective Light Valves", IBM Journal of Research & Development, vol. 42, 1998, IBM Centre for Advanced Studies, Website: www.research.ibm.com/journal/rd/423/colgan.html.

\* cited by examiner

*Primary Examiner*—Henry Hung Nguyen
(74) *Attorney, Agent, or Firm*—Blakely, Sokoloff, Taylor & Zafman LLP

(57) ABSTRACT

A lithography system for forming geometric patterns on a workpiece is described herein. The lithography system may include a reflective liquid crystal display comprising an array of configurable pixels, a radiation source for directing radiation onto the reflective liquid crystal display, a projection system for reducing a radiation pattern reflected by the reflective liquid crystal display and projecting the reduced radiation pattern onto a workpiece, and a stage for holding the workpiece. The lithography system may be used to form geometric patterns on a substrate during semiconductor fabrication.

6 Claims, 12 Drawing Sheets

REFLECTIVE LIQUID CRYSTAL DISPLAY LITHOGRAPHY SYSTEM

This is a Divisional Application of Ser. No.: 10/057,706 filed Jan. 24, 2002, which is presently pending.

FIELD OF THE INVENTION

The invention relates generally to a method and apparatus for forming a geometric pattern on a substrate for use in manufacturing electronic devices.

BACKGROUND OF THE INVENTION

Electronic components and interconnect patterns are typically formed on substrates such as semiconductor wafers and flat panel displays by means of projection lithography. As shown in FIG. 1, a projection lithography system typically comprises a radiation source 110, a fixed mask with a mask pattern 120, a substrate stage 150, and a projection system 130. During the projection lithography process, radiation from radiation source 110 is imposed on fixed mask 120. Radiation which passes through fixed mask 120 forms a radiation pattern which is focused onto photoresist coated substrate 140 by projection system 130, thereby forming a reduced image of the mask pattern on the substrate. The radiation pattern may represent the geometric shape of an electrical component or interconnect which is to be formed on the substrate by later processing steps. As shown, projection system 130 comprises an imaging lens disposed between the mask and the substrate for reducing and focusing the transmitted radiation pattern passing through the mask. However, projection system 130 may also include a condenser lens disposed between the radiation source and the mask for directing radiation to the mask as well as filters disposed between the radiation source and the condenser lens and the projection lens and the mask. Substrate 140 is removably fixed to substrate stage 150. A substrate positioning system may be provided to move substrate stage 150 and substrate 140 across the image plane.

Projection lithography operates similarly to typical film developing processes where an image contained on a photographic negative is imposed on photographic paper. In most film developing processes, the image embodied on a photographic negative is enlarged. However, in projection lithography, the mask pattern image is oftentimes reduced by a factor of 2–10× by the imaging lens. When the substrate is a silicon wafer and the radiation pattern represents an integrated circuit structure, the field size of the imaging lens is typically much smaller than the total substrate area which will be patterned and various operational modes, such as a step-and-repeat system, must be employed to pattern the entire substrate area.

Projection lithography is currently the most popular manufacturing technique for high-volume electronics production. However, fixed mask projection lithography systems suffer from numerous deficiencies. Electronic devices comprising multiple layers of features require multiple projection lithography exposures using a different mask for each exposure. Changing masks between exposures requires a significant amount of overhead time as each new mask must be accurately aligned and secured before the projection lithography tool can be brought back on-line for processing, resulting in high manufacturing costs. Additionally, the development of new circuit designs can be impeded by the long lead-time required to obtain prototype masks from a mask manufacturer, and significant product development costs may arise if multiple mask revisions are required. Moreover, manufacturers must purchase, store and maintain a large inventory of masks in order to produce a variety of electronic devices, resulting in high overhead expenses. Furthermore, manufacturing efficiency generally requires that a substrate wafer used in semiconductor chip manufacturing only contain multiple copies of a single semiconductor device. Given these deficiencies and the fact that projection lithography may contribute approximately one-third to one-half of the total cost of semiconductor device manufacturing, significant benefits could be realized if different patterns could be formed on a substrate without requiring a different fixed mask for each pattern.

U.S. Pat. No. 5,045,419 to Okumura discloses a projection lithography system wherein a transmissive liquid crystal display is substituted for a fixed mask. In Okumura, a geometric pattern is formed on the transmissive liquid crystal display by electrically changing the optical contrast of pixels contained in the display. The transmissive liquid crystal display is then exposed to a radiation source, and a radiation pattern is formed by the radiation which passes through the transmissive liquid crystal display. The radiation pattern is subsequently directed to a photoresist coated substrate. The Okumura projection lithography system allows different radiation patterns to be formed on a substrate without the need to change, align, and secure a different mask for each pattern. However, the address electrodes and pixel storage capacitors in a transmissive liquid crystal display may block incident radiation, resulting in reduced radiation throughput for small pixel sizes. This may lead to inconsistencies between the desired geometric pattern and the radiation pattern which is directed onto the photoresist coated substrate. In contrast, reflective liquid crystal displays may be formed with address electrodes and storage capacitors which do not block radiation reflected by the display. Hence, substituting a reflective liquid crystal display for a fixed mask in a projection lithography system may accommodate smaller pixel sizes without degrading the properties of the reflected radiation pattern.

As a result, a need exists for a projection lithography system wherein an electrically configurable reflective liquid crystal display is substituted for a fixed mask.

BRIEF DESCRIPTION OF THE DRAWINGS

The present invention is illustrated by way of example, and not by way of limitation, in the figures of the accompanying drawings.

DETAILED DESCRIPTION
Reflective Liquid Crystal Display Projection Lithography System In the present invention, a reflective liquid crystal display (LCD) is substituted for the fixed mask in the prior art projection lithography system. A geometric pattern is formed on the reflective LCD by electrically configuring an array of configurable pixels within the reflective display such that each pixel is configured to either a reflective or an opaque state. During projection lithography processing, the reflective LCD is exposed to a radiation source. Radiation from the radiation source incident to opaque pixels is prevented from passing through those particular pixels; however, radiation incident to reflective pixels is reflected by the reflective LCD, thereby forming a radiation pattern corresponding to the geometric pattern originally formed on the reflective LCD. The radiation pattern is subsequently reduced and directed to a photoresist coated substrate. When the projection lithography process is complete, the configurable pixels may be reconfigured in order to form an alternative geometric pattern without changing the physical location or orientation of the reflective LCD with respect to other elements of the projection lithography system.

Figure 1:
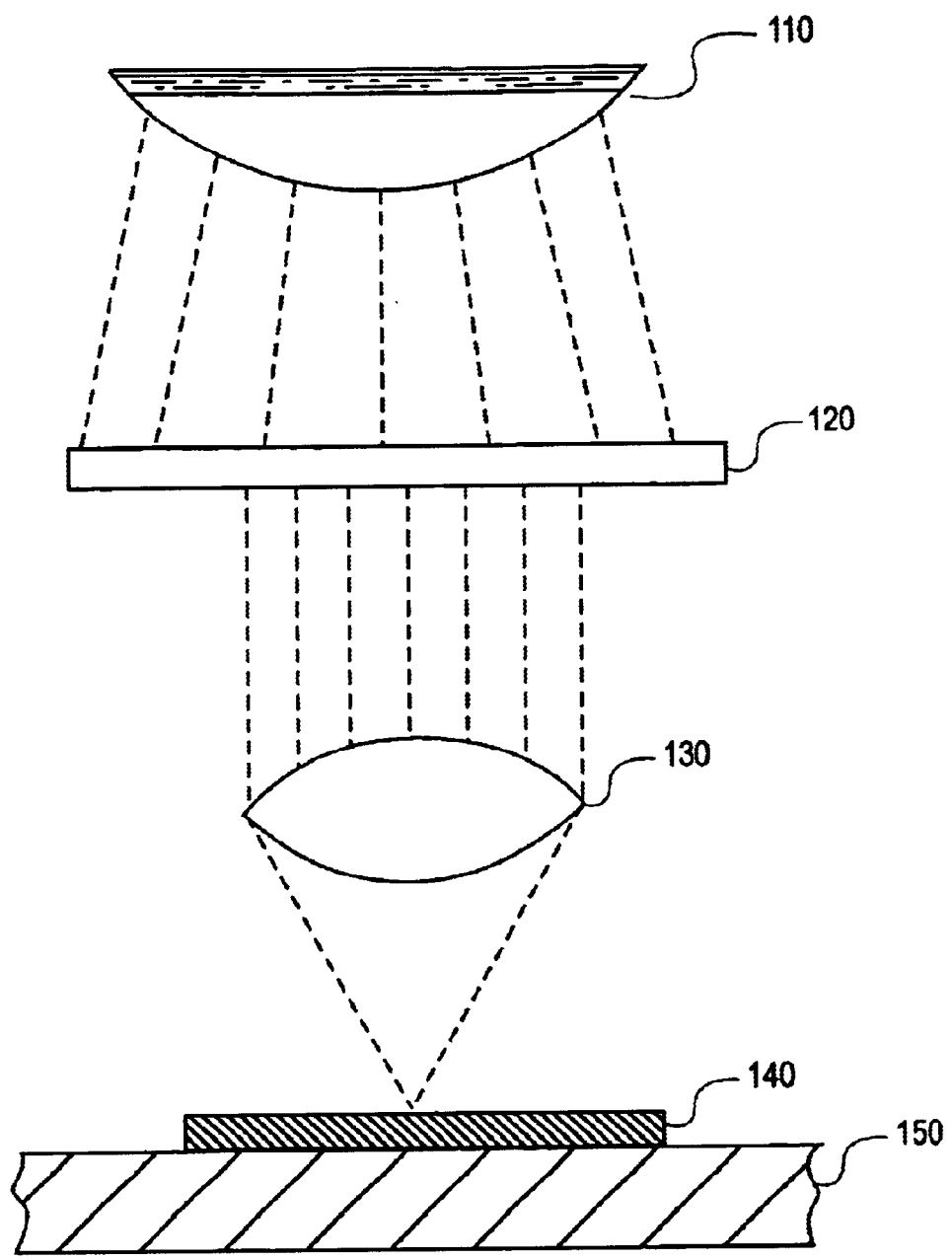
FIG. 1 is a schematic diagram illustrating a fixed mask projection lithography system.
Figure 2:
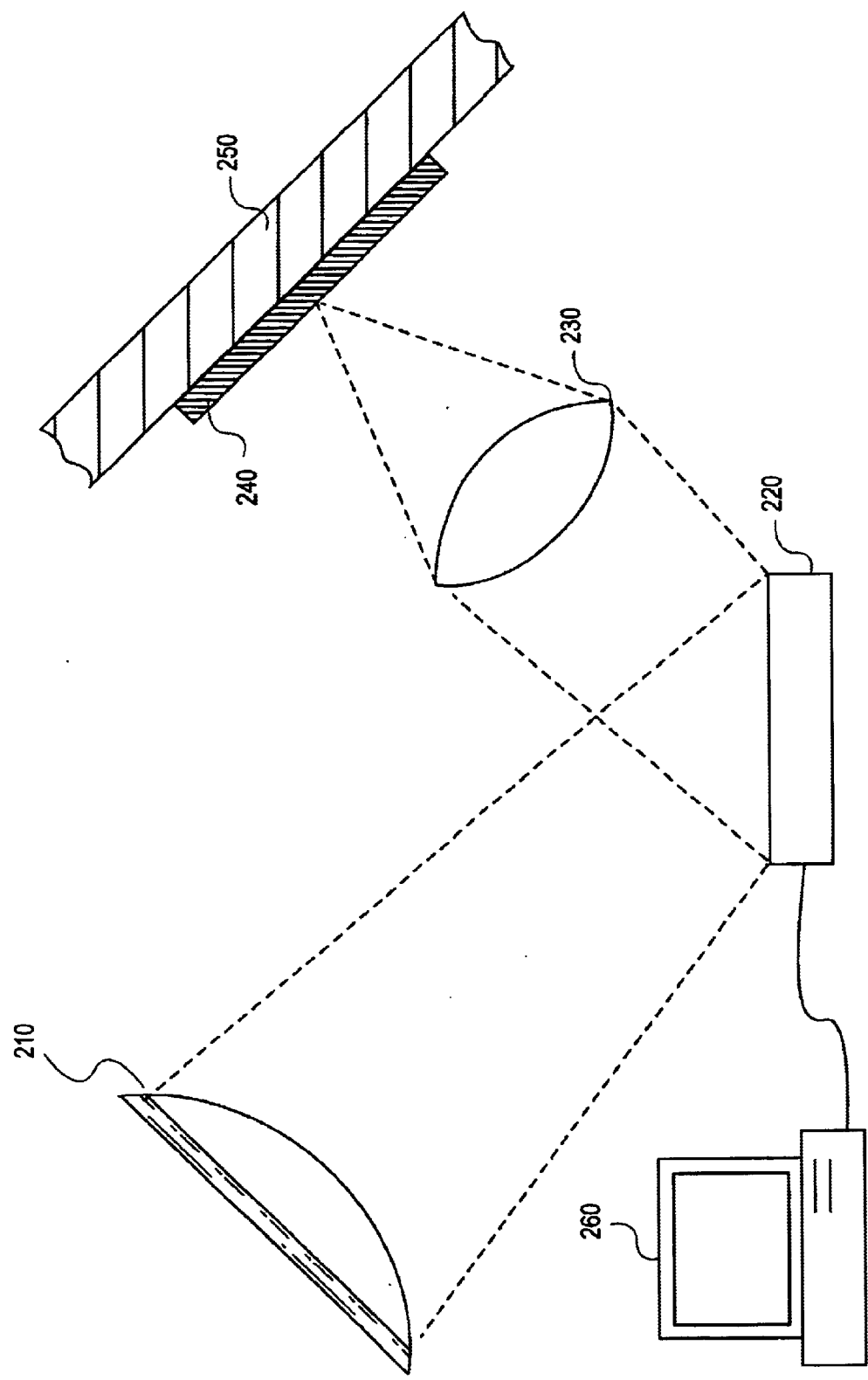
FIG. 2 is a schematic diagram illustrating one embodiment of a projection lithography system wherein a reflective liquid crystal display is substituted for a fixed mask.

A representative projection lithography system utilizing a reflective LCD is illustrated in FIG. 2. A geometric pattern representing the shape of an electrical component or interconnect which is to be formed on a substrate may be created on a computer using a variety of commercially available computer aided design software programs. Data representing the geometric pattern may be stored on electronic media such as a magnetic disk or CD-ROM and electronically transferred to imaging computer 260. Imaging computer 260 may process the geometric pattern data and generate output signals which are used to form an image of the geometric pattern on reflective LCD 220. The geometric pattern may be used to form the shape of an electrical component or interconnect on a semiconductor substrate. Alternatively, the geometric pattern may be used to produce a fixed mask, which is later used in conjunction with a fixed mask projection lithography system to form the shape of an electrical component or interconnect on a semiconductor substrate. Identical copies of the geometric pattern may be electronically transferred to multiple lithography systems in the same manufacturing facility. Additionally, identical copies of the geometric pattern may be electronically transferred to lithography systems situated in other manufacturing facilities located in disparate geographical areas.

A geometric pattern is formed on reflective LCD 220 by electrically configuring an array of configurable pixels within reflective LCD 220. During the projection lithography process, radiation from radiation source 210 is imposed on the geometric pattern contained in reflective LCD 220. Radiation reflected from reflective LCD 220 is reduced and focused onto photoresist covered substrate 240 by projection system 230, thereby forming a reduced image of the geometric pattern on substrate 240. As shown in FIG. 2, projection system 230 comprises an imaging lens disposed between reflective LCD 220 and substrate 240. Substrate 240 is removably fixed to substrate stage 250. Substrate stage 250 is connected to a substrate positioning system which provides for movement of substrate 240 across the image plane. The present invention may also include a condenser lens disposed between the radiation source and the reflective LCD for directing radiation to the reflective LCD as well as filters disposed between the radiation source and the condenser lens and the projection lens and the reflective LCD. These elements are well known in the art and have been omitted from FIG. 2 for purposes of clarity.

Reflective Liquid Crystal Displays

Liquid crystal displays are well known examples of passive display technology wherein ambient light is manipulated to form images. Reflective LCDs are commonly used in projection displays and other such devices where light is modulated spatially and/or temporally to form fixed or moving images on a viewing plane. In a reflective LCD, a reflective surface is positioned behind a liquid crystal layer. Portions of the liquid crystal layer may be electrically configured to selectively block or transmit incident radiation. Radiation which is transmitted through the liquid crystal layer is reflected by the reflective surface and transmitted back through the liquid crystal layer.

Figure 3A:
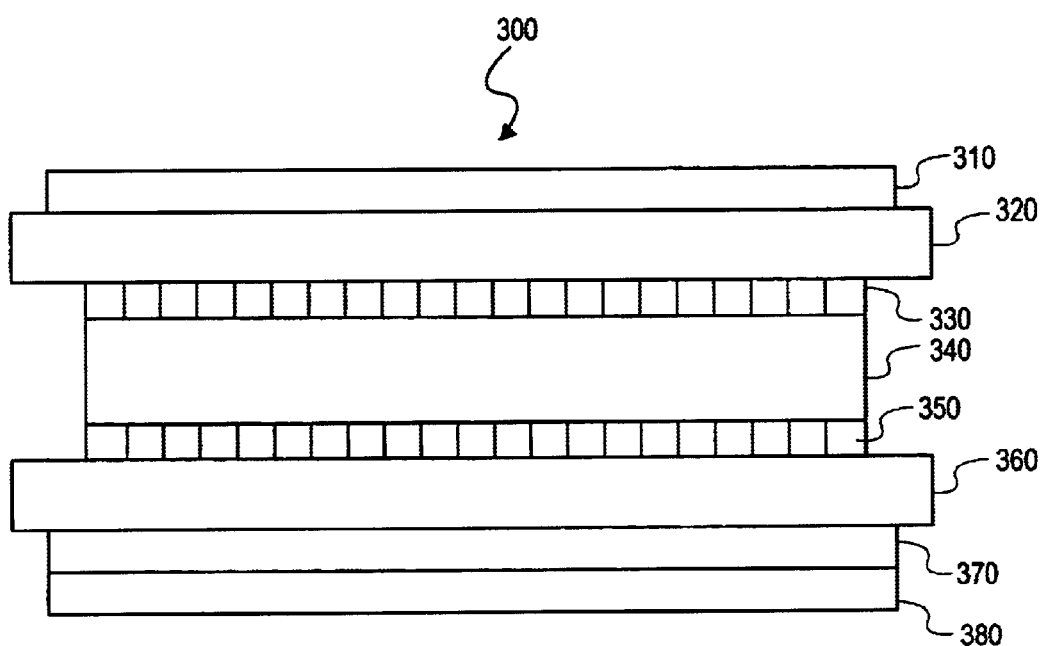
FIG. 3A is a schematic diagram illustrating one embodiment of a reflective liquid crystal display.

One embodiment of a reflective mode liquid crystal display is illustrated in FIG. 3A. Reflective liquid crystal display 300 comprises front polarizer 310, front substrate 320, front electrodes 330, liquid crystal layer 340, rear electrodes 350, rear substrate 360, rear polarizer 370, and reflector 380. Front and rear substrates 320 and 360 are preferably formed from quartz glass approximately 1–2 mm in thickness. Front electrodes 330 may be formed on the bottom surface of front substrate 320 and rear electrodes 350 may be formed on the top surface of rear substrate 360 from a conductive material which is generally transparent to radiation from radiation source 210. For example, if radiation source 210 emits visible light, front electrodes 330 and rear electrodes 350 may be formed from indium-tin-oxide with a thickness of approximately 1000 angstroms. Liquid crystal layer 340 may be formed by sandwiching a layer of liquid crystal material between the bottom surface of front substrate 320 and the top surface of rear substrate 360 such that the adjacent faces of the front and rear substrates are spaced apart by approximately 10 $\mu$m. Typical liquid crystal displays use a twisted nematic liquid crystal material available from commercial sources such as the Merck Group, RODIC, Hoechst, and others. Reflector 380 may be formed from a layer of aluminum approximately 150 nm in thickness deposited on the lower surface of rear polarizer 370.

In alternative embodiments front and rear substrates 320 and 360 may be formed from soda lime, borasilicate, white crown glass, or other similar materials. Additionally, front and rear electrodes 330 and 350 may be formed from transparent conductive materials such as tin-oxide and reflector 380 may be formed from silver or other such reflective materials.

Figure 3B:
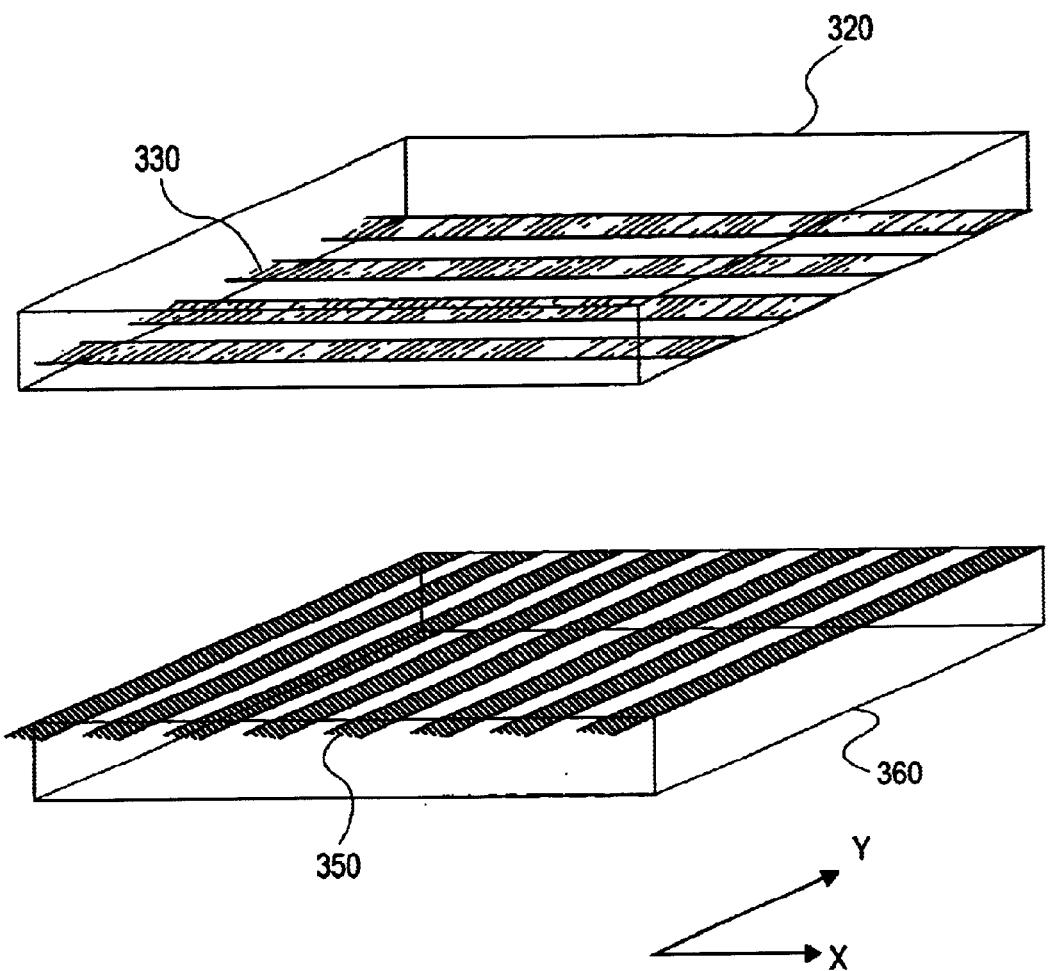
FIG. 3B is a schematic diagram illustrating one embodiment of an electrode arrangement in a reflective liquid crystal display.

As illustrated in FIG. 3B, front electrodes 330 are formed on the bottom surface of front substrate 320 and rear electrodes 350 are formed on the top surface of rear substrate 360. Each front electrode may be oriented parallel to adjacent front electrodes such that front electrodes 330 consist of a series of parallel electrode lines. Each front electrode may be approximately 200 $\mu$m in width, and adjacent electrodes may be separated by a distance of approximately 50 $\mu$m. Similarly, each rear electrode may be oriented parallel to adjacent rear electrodes such that rear electrodes 350 consist of a series of parallel electrode lines. Each rear electrode may be approximately 200 µm in width, and adjacent electrodes may be separated by a distance of approximately 50 µm.

Front electrodes 330 and rear electrodes 350 are typically formed perpendicular to each other such that the front and rear electrode lines overlap at right angles. A pixel is formed where each front and rear electrode overlap. Hence, an array of pixels is formed from the combined overlap areas between front electrodes 330 and rear electrodes 350. Each pixel within the array of pixels may be individually addressed by applying a potential difference (voltage) across a single front electrode line and a single rear electrode line.

When a potential difference is applied across a single front electrode and a single rear electrode, an electric field is formed at the pixel defined by the overlap area between the two electrodes. The electric field within the pixel causes liquid crystal molecules in liquid crystal layer 340 to orient themselves with respect to the electric field. The nematic liquid crystal material in liquid crystal layer 340 may be selected such that the liquid crystal molecules orient themselves to either absorb or transmit radiation incident to the liquid crystal display when an electric field is present within a particular pixel. For purposes of discussion, when a potential difference is applied to a pixel, the pixel is considered to be in an ON state. Conversely, when a potential difference is not applied to a pixel, the pixel is considered to be in an OFF state.

Figure 4A:
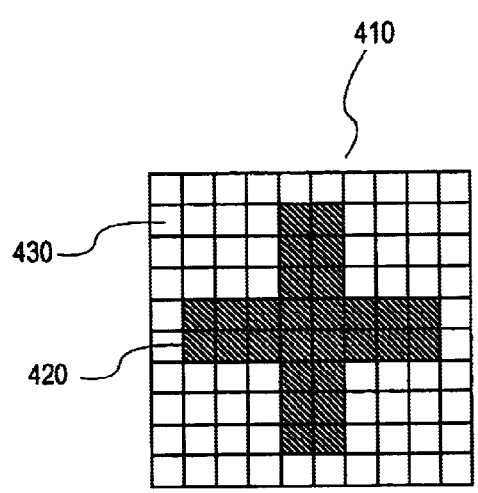
FIG. 4A is an illustration of a positive mode liquid crystal display.

Typically, liquid crystal displays operate in a positive mode where the background of the display is light and the image pattern is dark. FIG. 4A illustrates a positive mode liquid crystal display where pattern 410 is formed from dark pixels 420 on light background 430. In a typical positive mode liquid crystal display, the nematic liquid crystal is selected such that radiation incident to the liquid crystal layer is absorbed when a pixel is ON. Consequently, when a pixel is OFF, radiation incident to the liquid crystal is transmitted through the liquid crystal layer.

Referencing FIG. 3A, radiation incident to a positive mode reflective LCD passes through front polarizer 310, front substrate 320, and front electrodes 330. At liquid crystal layer 340, radiation is absorbed by ON pixels and radiation is transmitted through liquid crystal layer 340 by OFF pixels. Radiation which is transmitted through liquid crystal layer 340 also passes through rear electrodes 350, rear substrate 360, and rear polarizer 370. The radiation is then reflected by reflector 380 and transmitted back through rear polarizer 370, rear substrate 360, rear electrodes 350, liquid crystal layer 340, front electrodes 330, front substrate 320, and front polarizer 310. Hence, a positive mode reflective LCD generates a negative reflected radiation image pattern.

Figure 4B:
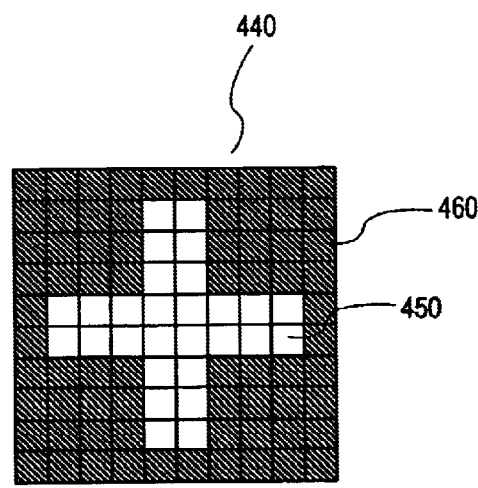
FIG. 4B is an illustration of a negative mode liquid crystal display.

In a negative mode liquid crystal display, the background of the display is dark and the image pattern is light. FIG. 4B illustrates a negative mode liquid crystal display where pattern 440 is formed from light pixels 450 on dark background 460. In a negative mode liquid crystal display, the nematic liquid crystal is typically selected such that radiation incident to the liquid crystal layer is transmitted when a pixel is ON. Consequently, when a pixel is OFF, radiation incident to the liquid crystal is absorbed by the liquid crystal layer.

As described above in reference to FIG. 3A, radiation incident to a negative mode reflective LCD passes through front polarizer 310, front substrate 320, and front electrodes 330. At liquid crystal layer 340, radiation is absorbed by OFF pixels and radiation is transmitted through liquid crystal layer 340 by ON pixels. Radiation which is transmitted through liquid crystal layer 340 also passes through rear electrodes 350, rear substrate 360, and rear polarizer 370. The radiation is then reflected by reflector 380 and transmitted back through rear polarizer 370, rear substrate 360, rear electrodes 350, liquid crystal layer 340, front electrodes 330, front substrate 320, and front polarizer 310. Hence, a negative mode reflective LCD generates a positive reflected radiation image pattern.

Referencing FIG. 2, data representing a geometric pattern may be stored on electronic media such as a magnetic disk or CD-ROM. The geometric pattern may correspond to an electronic component, interconnect pattern, or other such features which are commonly formed on semiconductor wafers, flat panel displays, or printed circuit boards by means of projection lithography. The data may be transferred to imaging computer 260 which processes the geometric pattern data and generates output signals which are used to form an image of the geometric pattern on reflective LCD 300. More specifically, imaging computer 260 applies a potential difference across selected front and rear electrodes as necessary to form an image of the geometric pattern across an array of pixels contained within the reflective LCD. For example, imaging computer 260 may apply a voltage of +5 volts to selected front electrodes and −5 volts to selected rear electrodes, thereby generating a potential difference of 10 volts across pixels which are ON. In a positive mode liquid crystal display, the geometric image is represented by dark pixels on a light background, much like a light-field polarity mask in a fixed mask projection lithography system. Conversely, in a negative mode liquid crystal display, the geometric image is represented by light pixels on a dark background, much like a dark-field polarity mask in a fixed mask projection lithography system.

The photoresist used to coat substrate 240 is generally selected such that the peak sensitivity of the photoresist corresponds to a range of radiation wavelengths emitted by radiation source 210. In order to prevent degradation of the reflected radiation pattern, portions of liquid crystal layer 340 which have been configured to transmit incident radiation must not absorb radiation within that wavelength range. Similarly, the materials used to form front substrate 320, front electrodes 330, rear electrodes 350, rear substrate 360, and reflector 380 must be selectively chosen so as to prevent the absorption of radiation at wavelengths corresponding to the wavelength range of radiation source 210. For example, if an excimer laser radiation source which emits radiation with a wavelength of 220 nm is used in conjunction with a photoresist having a peak sensitivity of approximately 220 nm, liquid crystal layer 340, front substrate 320, front electrodes 330, rear electrodes 350, rear substrate 360, and reflector 380 must be chosen so as to not absorb the 220 nm wavelength radiation emitted by the excimer laser. In such an embodiment, liquid crystal layer 340 could be composed of Merck Group liquid crystal compound MLC-9300-100, front and rear substrates 320 and 360 could be formed from quartz glass, front and rear electrodes 330 and 350 could be formed from In—Sn oxide, and reflector 380 could be formed from silver.

Reflective Rear Electrode Reflective LCD

Figure 5:
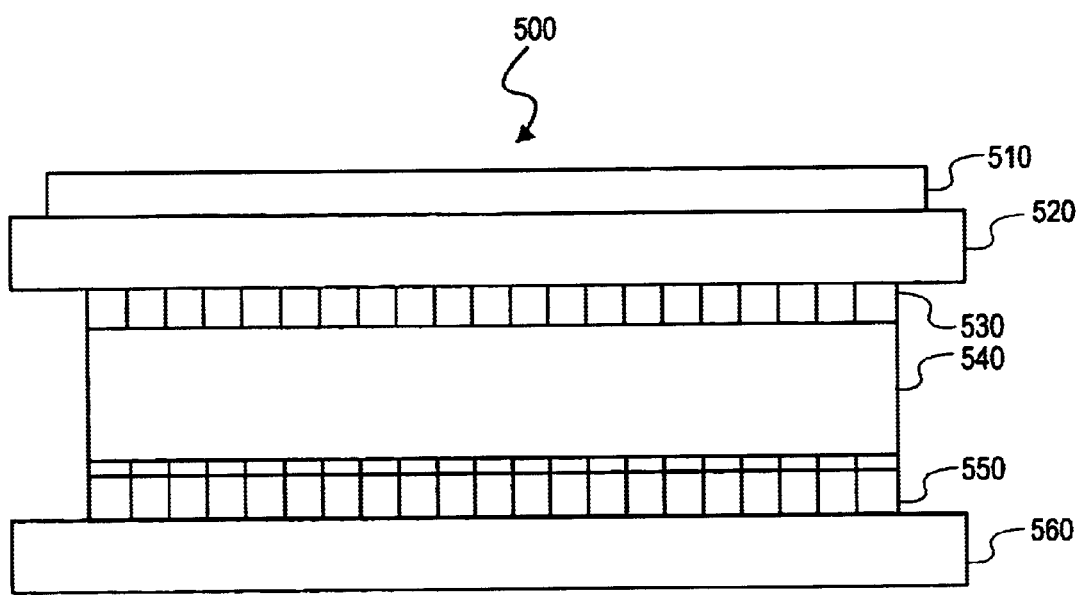
FIG. 5 is a schematic diagram illustrating one embodiment of a reflective liquid crystal display.

FIG. 5 illustrates another embodiment of a reflective mode liquid crystal display which utilizes a reflective rear electrode design. Reflective liquid crystal display 500 comprises front polarizer 510, front substrate 520, front electrodes 530, liquid crystal layer 540, reflective rear electrodes 550, and rear substrate 560. Much like reflective liquid crystal display 300 illustrated in FIG. 3, front and rear substrates 520 and 560 are preferably formed from quartz glass approximately 1–2 mm in thickness. Front electrodes 530 may be formed on the bottom surface of front substrate 520 from a conductive material which is generally transparent to radiation from radiation source 210. For example, if radiation source 210 emits visible light, front electrodes 530 may be formed from indium-tin-oxide with a thickness of approximately 1000 angstroms. Reflective rear electrodes 550 may be formed on the top surface of rear substrate 560 from a highly reflective conductive material such as aluminum. Alternatively, reflective rear electrodes 550 may be formed from a base layer of conductive indium-tin-oxide with a top reflective layer formed from aluminum or another conductive material with high reflectivity.

Forming rear electrodes 550 from a reflective material enables the reflective layer of the reflective LCD to be placed directly adjacent to the liquid crystal layer. Because reflective rear electrodes 550 perform dual functions as both electrical connections and radiation mirrors, reflector 380 and rear polarizer 370 required in reflective LCD 300 are no longer necessary.

Liquid crystal layer 540 may be formed by sandwiching a layer of liquid crystal material between the bottom surface of front substrate 520 and the top surface of rear substrate 560 such that the adjacent faces of the front and rear substrates are spaced apart by approximately 10 $\mu$m. Front electrodes 530 and reflective rear electrodes 550 may be structured substantially the same as front and rear electrodes 330 and 350 in reflective LCD 300 such that an array of pixels is formed from the combined overlap areas between front electrodes 330 and rear electrodes 350. As in reflective LCD 300, each pixel within the array of pixels contained in reflective LCD 500 may be individually addressed by applying a potential difference across a single front electrode line and a single rear electrode line.

As previously discussed in reference to FIG. 3, radiation incident to a reflective LCD passes through front polarizer 510, front substrate 520, and front electrodes 530. Portions of liquid crystal layer 540 within reflective LCD 500 are configured to either absorb or transmit radiation. Radiation which is transmitted through liquid crystal layer 540 is reflected by reflective rear electrodes 550 and transmitted back through liquid crystal layer 540, front electrodes 530, front substrate 520 and front polarizer 510. As in the previous embodiment, a positive mode reflective LCD generates a negative reflected radiation image pattern and a negative mode reflective LCD generates a positive reflected radiation image pattern. Similarly, in order to prevent degradation of the reflected radiation pattern, portions of liquid crystal layer 540 which have been configured to transmit incident radiation must not absorb radiation within the range of radiation wavelengths emitted by radiation source 210. Furthermore, the materials used to form front substrate 520, front electrodes 530, and reflective rear electrodes 550 must be selectively chosen so as to prevent the absorption of radiation at wavelengths corresponding to the to the wavelength range of radiation source 210.

Reflective Rear Electrode through Substrate Reflective LCD

Figure 6A:
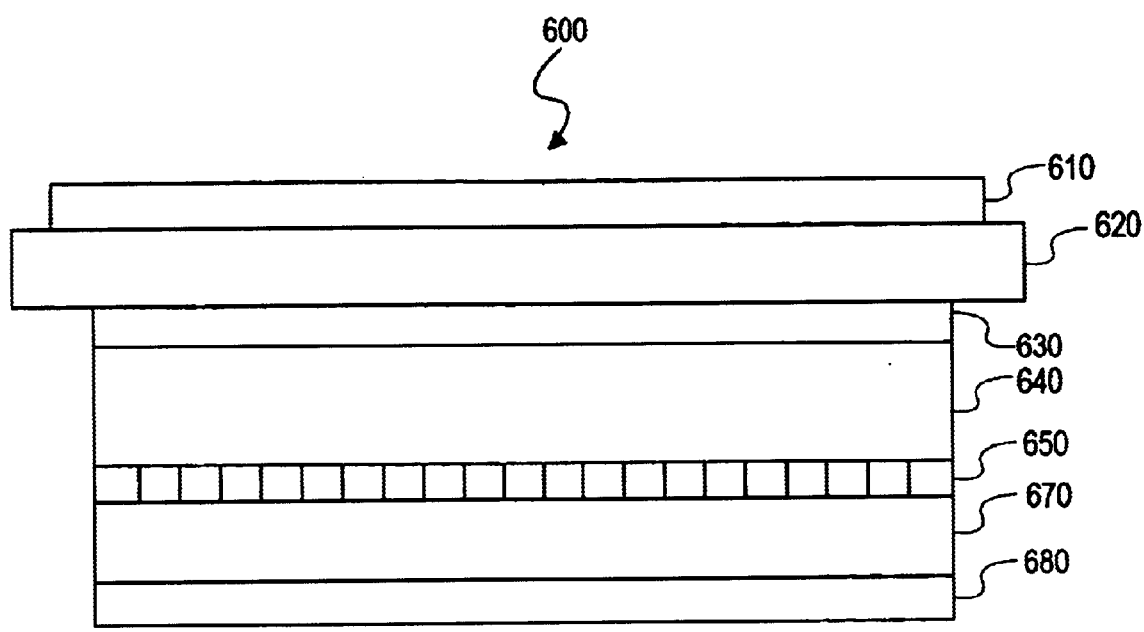
FIG. 6A is a schematic diagram illustrating one embodiment of a reflective liquid crystal display.

FIG. 6A illustrates another embodiment of a reflective mode liquid crystal display which utilizes electrode through substrate addressing to selectively apply voltage to an array of reflective rear electrodes. In such an embodiment, a rear substrate provides a third dimension for accessing the reflective rear electrode terminals. Hence, integrated gate transistor structures may be used to address reflective rear electrode elements through the rear substrate.

Reflective rear electrodes may perform dual functions as both electrical connections and radiation mirrors in a reflective LCD. More specifically, reflective rear electrodes may control the polarity of portions of a liquid crystal layer contained within a reflective LCD. Additionally, reflective rear electrodes may reflect radiation transmitted through the liquid crystal layer of a reflective LCD display. A reflective liquid crystal display may contain an array of such reflective rear electrodes, each reflective electrode defining the size and shape of a pixel in the reflective LCD.

A reflective LCD utilizing electrode through substrate addressing may allow for a higher pixel density compared to reflective LCD designs in which pixels are addressed through overlapping line electrodes. Additionally, electrode through substrate addressing allows each pixel to be individually addressed. As a result, electrode through substrate reflective LCD's may contain very large number of individually addressable pixels which may be addressed simultaneously and independently.

In FIG. 6A, reflective liquid crystal display 600 comprises polarizer 610, front substrate 620, front electrode 630, liquid crystal layer 640, reflective rear electrodes 650, transistor structures 670, and rear substrate 680. Front substrate 620 may be formed from quartz glass approximately 1–2 mm in thickness. Front electrode 630 may be formed from a conductive material which is generally transparent to radiation from radiation source 210. For example, if radiation source 210 emits visible light, front electrodes 330 and rear electrodes 350 may be formed from indium-tin-oxide with a thickness of approximately 1000 angstroms. Reflective rear electrodes 650 may be formed above transistor structures 670 from aluminum. Rear substrate 680 may be a silicon substrate and transistor structures 670 may be formed on rear substrate 680 using a variety of well known semiconductor manufacturing processes.

In alternative embodiments front substrate 620 may be formed from soda lime, borasilicate, white crown glass, or other similar materials. Additionally, front electrode 630 may be formed from transparent conductive materials such as tin-oxide and reflective rear electrodes 650 may be formed from silver or other highly reflective conductive materials. Rear substrate 680 may be GaAs, InP, or other such materials which are used to fabricate semiconductor devices.

Figure 6B:
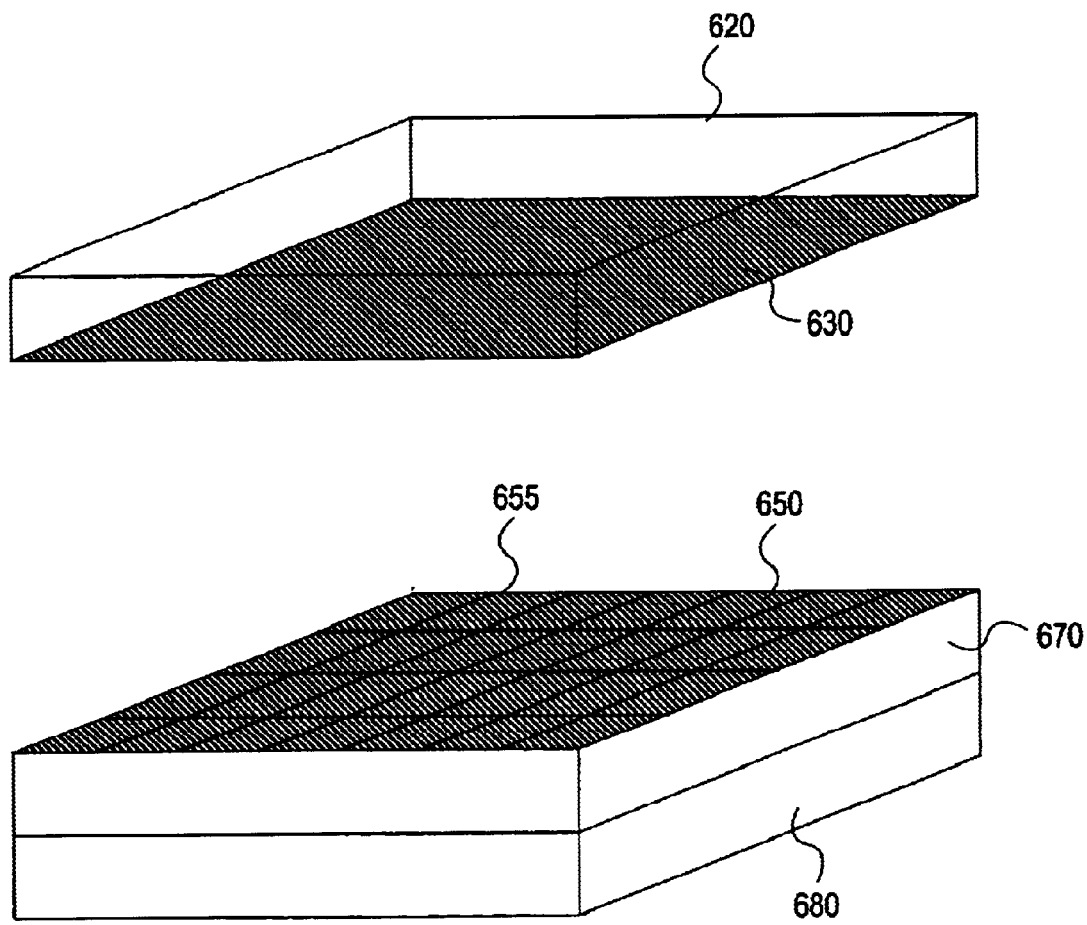
FIG. 6B is a schematic diagram illustrating one embodiment of an electrode arrangement in a reflective liquid crystal display.

FIG. 6B provides an orthogonal view of front electrode 630 formed on front substrate 620 and reflective rear electrodes 650 formed above transistor structures 670 and rear substrate 680. Front electrode 630 may be formed as a single electrode element which covers the bottom surface of glass panel 630 adjacent to liquid crystal layer 640. As shown in FIG. 6B, reflective rear electrodes 650 may be formed as a two-dimensional array of electrode elements wherein each electrode element is isolated from adjacent electrode elements by insulating material 655. Insulating material 655 may be $SiO_2$ or other such insulating materials as are commonly used in semiconductor devices.

One embodiment of a reflective LCD utilizing a two-dimensional array of adjacent electrode elements is described in "On-chip Metallization Layers for Reflective Light Valves" by E. G. Colgan and M. Uda. (IBM Journal of Research & Development, Vol. 42, No. 3) Colgan describes a reflective LCD comprising an array of reflective rear electrodes where each electrode is integrated with a gate transistor structure formed on a silicon substrate. A liquid crystal layer is sandwiched between the array of reflective rear electrodes and a front electrode formed on the lower surface of a glass cover plate. Pixels in the reflective LCD are formed between each reflective rear electrode and the front electrode.

The integrated electrode-transistor structures described in Colgan are formed by medium-voltage CMOS processing techniques commonly used in the manufacture of integrated circuit devices. Each pixel in the reflective LCD display has an integrated gate transistor structure and external data driver. As a result, each pixel within a reflective LCD utilizing through substrate addressing may be addressed independently of other pixels, and all pixels may be addressed simultaneously.

Figure 6C:
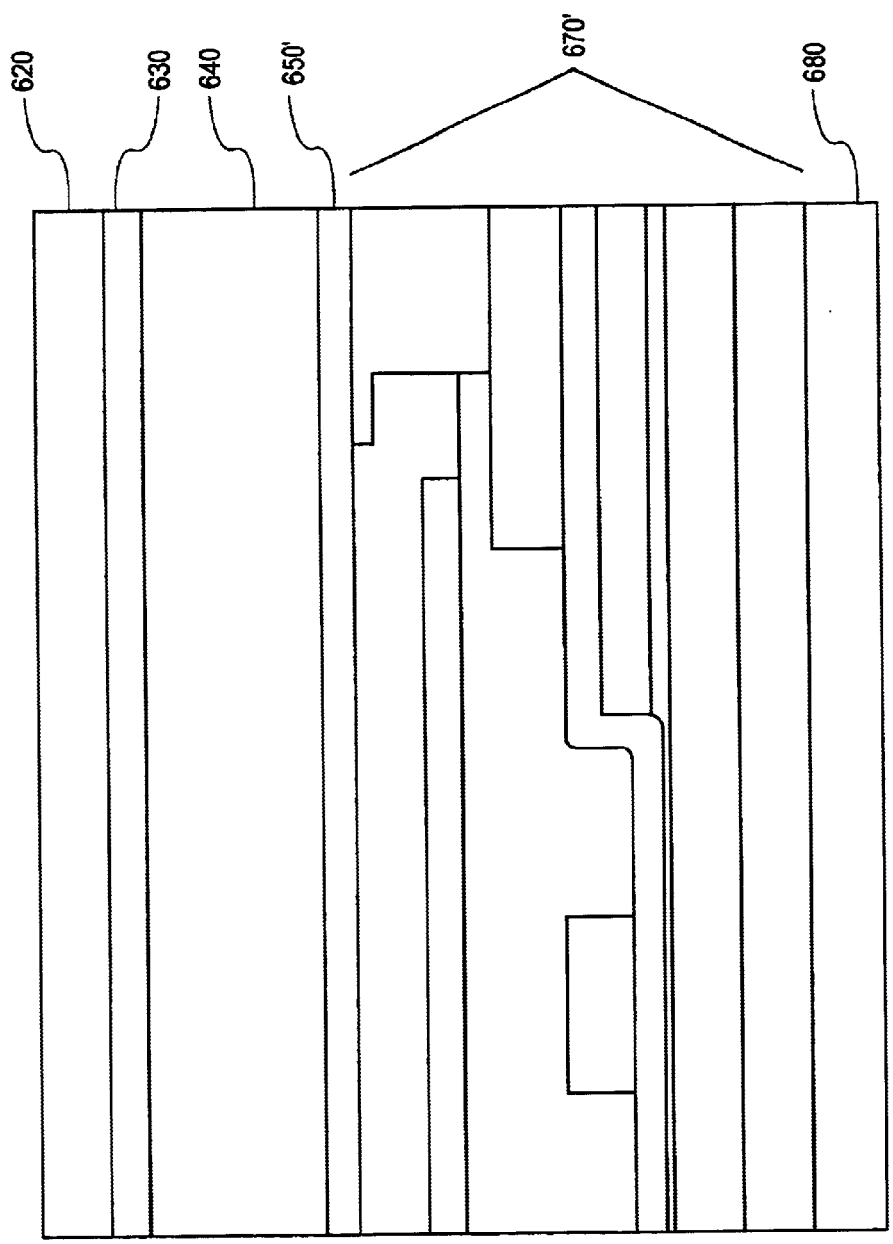
FIG. 6C is a schematic diagram illustrating one embodiment of a reflective liquid crystal display.

FIG. 6C is a cross-sectional view of a reflective LCD which features a reflective rear electrode 650' with an integrated gate transistor structure 670'. Integrated gate structure 670' comprises an arrangement of $SiO_2$ layers, poly-silicon layers, and metal layers formed on Si substrate 680 using a variety of well known semiconductor manufacturing processes. In order to improve adhesion and reduce contact resistance, reflective rear electrode 650' is formed from a 150 nm thick layer of aluminum above a 30 nm thick lay of Ti. A tungsten stud provides a conductive via linking reflective electrode 650' to integrated gate transistor structure 670'. Prior to depositing reflective rear electrode 650', the top surface of integrated gate transistor structure 670' may be planarized in order to optimize the flatness of the reflective rear electrode mirror surface. Planarization of integrated gate transistor structure 670' may be accomplished by means of a chemical mechanical polishing process.

Optical throughput of a reflective LCD depends upon the reflectivity, flatness, and fill factor of reflective rear electrodes 650. The fill factor is primarily determined by the amount of non-reflective space between the top surfaces of adjacent reflective rear electrodes, such as space occupied by insulating material 655 described above. As a specific example, a reflective LCD comprised of 17 $\mu$m square pixels with a nominal space of 1.7 $\mu$m between adjacent pixels has a fill factor of approximately 81%. Optical throughput of a reflective LCD is proportional to fill factor, and fill factor is inversely proportional to the amount of space between adjacent electrodes. Hence, optical throughput may be increased by reducing the space between adjacent electrodes. However, this may increase the probability of shorts between adjacent electrodes, resulting in non-functional pixels within a reflective LCD.

In order to maintain high contrast and uniformity, spacers may be placed between reflective rear electrodes 650 and glass panel 620. In order to avoid blocking reflected radiation from reflective rear electrodes 650, spacers may be formed between adjacent electrodes. However, contrast ratio of the reflective LCD may be degraded if an excessive number of spacers is used.

In the previous embodiment, reflective rear electrodes 650 in FIG. 6A were structured as a two-dimensional array of electrode elements. However, reflective rear electrodes 650 may also be formed as a three-dimensional array comprising multiple layers of reflective electrodes. Each layer may comprise a two-dimensional array of reflective electrodes with reflective electrodes from one layer positioned between reflective electrodes from another layer. Additionally, electrode layers may be interleaved in order to minimize non-reflective space between adjacent electrodes. An insulating material may be interposed between the reflective electrode layers and between adjacent electrodes on the same layer in order to prevent shorting between electrodes.

Each reflective electrode in the three-dimensional array of reflective electrodes may be connected to an integrated gate transistor structure formed on a semiconductor substrate. As a result, each reflective electrode may be addressed independently of other reflective electrodes, and all reflective electrodes may be addressed simultaneously. A liquid crystal layer is sandwiched between the array of reflective rear electrodes and a front electrode formed on the lower surface of a front substrate. Pixels in the reflective LCD are formed between each reflective rear electrode and the front electrode. During operation, a potential difference of approximately 2.5–15 volts may be applied across individual reflective electrodes and the front electrode, such that each pixel in the reflective LCD is selectively configured to reflect or absorb incident radiation. Other voltage ranges may also be applied, depending on the structure and configuration of the reflective LCD device.

Figure 6D:
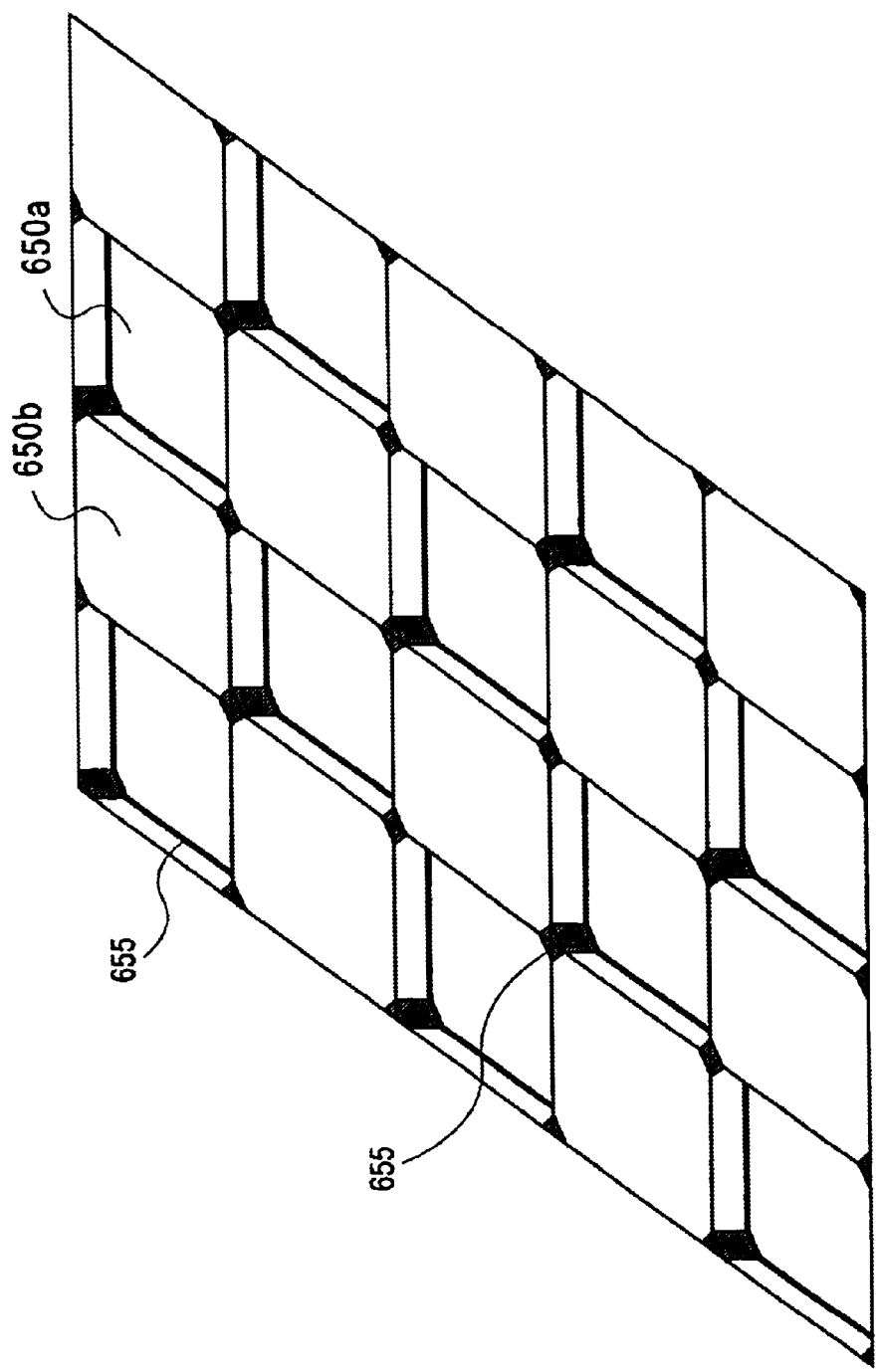
FIG. 6D is a schematic diagram illustrating one embodiment of a reflective liquid crystal display.

FIG. 6D shows an orthogonal view of a three-dimensional array of reflective electrodes comprising two layers of interleaving reflective electrodes. Such an array may be used to form reflective rear electrodes 650 in FIG. 6A. Referencing FIG. 6D, upper reflective electrodes 650b are arranged in an alternating grid pattern above lower reflective electrodes 650a such that a portion of a lower reflective electrode is exposed in the space between any two upper reflective electrodes. Hence, upper reflective electrodes 650b and lower reflective electrodes 650a form a three-dimensional "checker-board" array of reflective electrodes wherein alternating electrodes are formed on different planes. In one embodiment, each reflective electrode in the three-dimensional array of reflective electrodes measures approximately 5 $\mu$m×5 $\mu$m, resulting in pixels with an individual area of 25 $\mu m^2$. In alternative embodiments, each reflective electrode may measure 1 $\mu$m×1 $\mu$m or less, resulting in pixels with an individual area of 1 $\mu m^2$ or less. Reflective electrodes with smaller or larger reflective areas may be used, depending on the projection lithography application.

Insulating material 655 may be deposited between upper reflective electrodes 650b and lower reflective electrodes 650a, thereby forming an insulating layer between the lower surfaces of upper reflective electrodes 650b and the upper surfaces of lower reflective electrodes 650a. Insulating material 655 may also be formed between adjacent reflective electrodes on the same layer. For example, insulating material 655 may be formed between adjacent coplanar reflective upper electrodes 650b and between adjacent co-planar lower reflective electrodes 650a. Insulating material 655 may be $SiO_2$ or other such insulating materials as are commonly used in semiconductor devices.

Figure 6E:
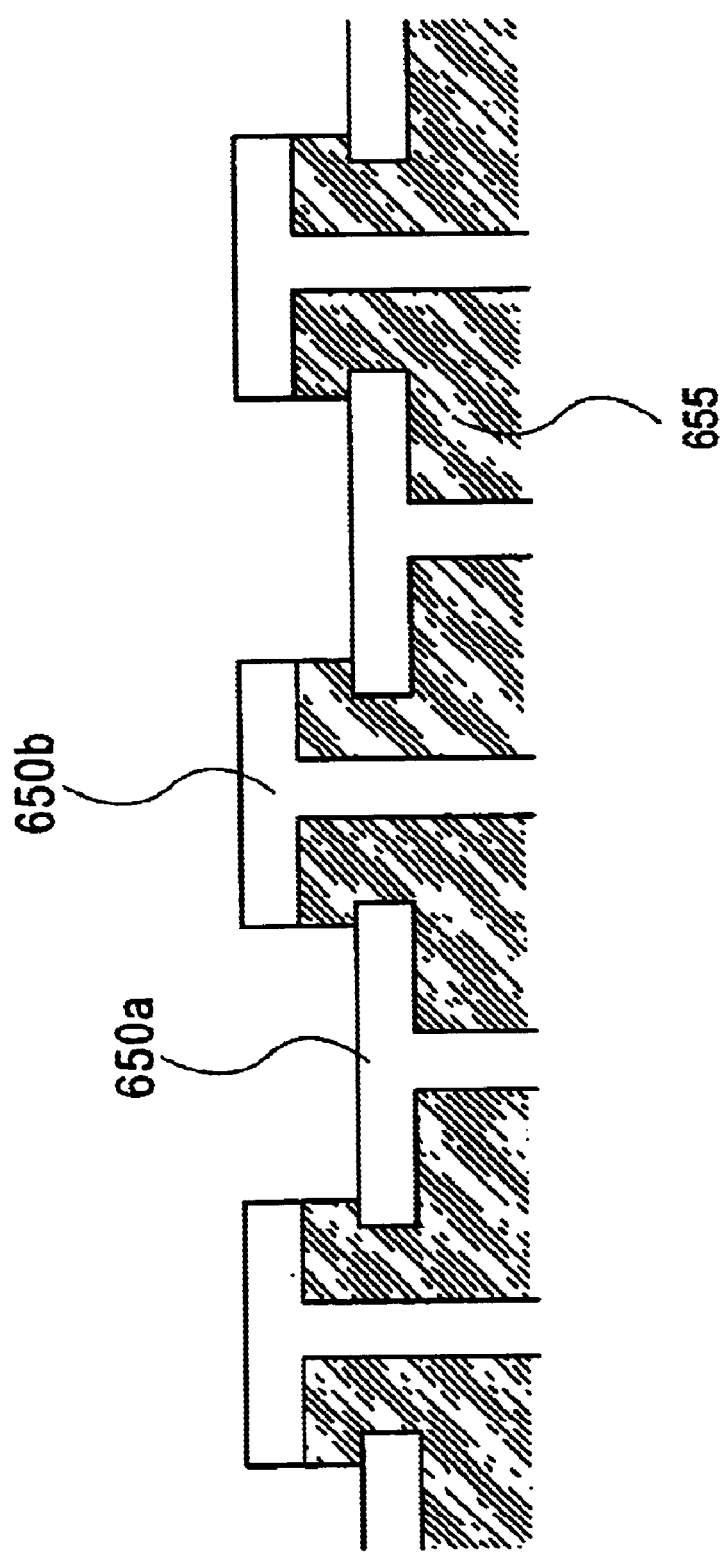
FIG. 6E is a schematic diagram illustrating one embodiment of a reflective liquid crystal display.

FIG. 6E shows a cross-sectional view of the three-dimensional array of reflective electrodes shown in FIG. 6D. As shown in FIG. 6E, lower reflective electrodes 650a and upper reflective electrodes 650b may be arranged in alternating grid patterns such that a portion of a lower reflective electrode is exposed in the gap between alternating upper reflective electrodes 650b. Lower reflective electrodes 650a may overlap adjacent upper reflective electrodes 650b; conversely, upper reflective electrodes 650b may overlap adjacent lower reflective electrodes 650a. Consequently, non-reflective space between the top surfaces of adjacent reflective electrodes may be minimized, thereby resulting in a high fill factor. For example, as shown in FIG. 6D, non-reflective space within the three-dimensional reflective electrode array is limited to areas where adjacent corners of upper reflective electrodes 650b are separated by insulating material 655. As previously discussed, optical throughput of a reflective LCD is directly proportional to the fill factor of the reflective electrode structure. Hence, a reflective LCD utilizing the three-dimensional reflective electrode array formed by lower reflective electrodes 650a and upper reflective electrodes 650b may offer significant optical throughput advantages.

Upper reflective electrodes 650*b* and lower reflective electrodes 650*a* may be formed from a 150 nm thick layer of aluminum. Each upper and lower electrode may be linked to an integrated gate transistor structure by means of a conductive stud formed from tungsten, aluminum, copper, or other such materials. Lower reflective electrodes 650*a* are arranged such that the conductive studs connecting upper reflective electrodes 650*b* to transistor structures 670 are prevented from shorting against lower reflective electrodes 650*a*.

In order to optimize the flatness of lower reflective electrodes 650*a*, the top surface of transistor structures 670 may be planarized prior to depositing lower reflective electrodes 650*a*. Planarization of transistor structures 670 may be accomplished by means of chemical mechanical polishing. A similar planarization process may be performed on insulating material 655 formed above the upper surface of lower reflective electrodes 650*a* in order to improve the flatness of upper reflective electrodes 650*b*. Additionally, in order to improve contrast and uniformity within the reflective LCD, spacers posts may be formed between upper reflective electrodes 650*b* and glass panel 620. For example, insulating material 655 which insulates adjacent corners of upper reflective electrodes 650*b* could be formed to provide spacer posts as described above.

Referring again to FIG. 2, radiation source 210 may be selected to emit visible light, ultraviolet light, extreme ultraviolet light, x-rays, electrons, ions or other forms of radiation as are commonly used in projection lithography processing. Generally, the resolution of a projection lithography system is proportional to the wavelength of the radiation source. Hence, a radiation source which emits radiation with a higher wavelength is capable of producing finer geometric pattern features on a substrate.

Figure 7:
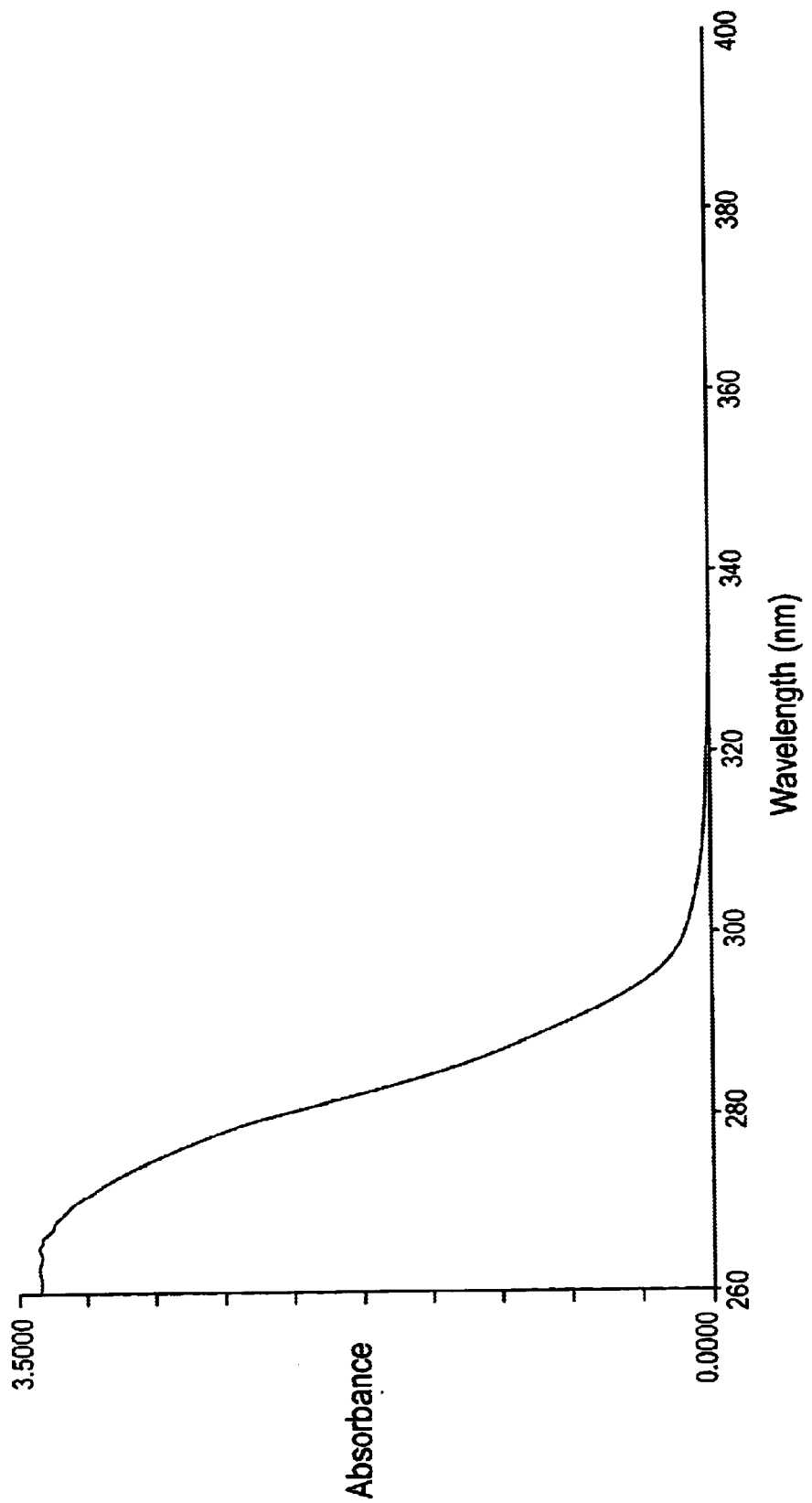
FIG. 7 is a graph illustrating the absorption spectrum of liquid crystal compound ZLI-3376-000/100 sold by the Merck Group.

In order to prevent degradation of the radiation pattern reflected by a reflective LCD, the liquid crystal material contained in the reflective LCD must be chosen such that the wavelength of radiation emitted by radiation source 210 is outside the absorption spectrum of the liquid crystal material. For example, FIG. 7 illustrates the absorption spectrum for the liquid crystal compound ZLI-3376-000/100 sold by the Merck Group. The absorption spectrum shows that incident light with a wavelength greater than approximately 340 nm will not be absorbed by the liquid crystal material. However, incident light with a wavelength of 260–340 nm will be absorbed by the liquid crystal material, with the lower wavelength light being absorbed to a greater extent than the higher wavelength light. Consequently, in one embodiment of the present invention, radiation source 210 may be an excimer laser with a wavelength greater than approximately 340 nm and the ZLI-3376-000/100 liquid crystal compound may be used as a liquid crystal layer in the reflective LCD. In an alternative embodiment of the present invention, an excimer laser with a wavelength of approximately 220 nm may be used in conjunction with Merck Group liquid crystal compound MLC-9300-100.

Projection System

As previously discussed with respect to FIG. 2, the present invention may include a projection system 230 for directing radiation from radiation source 210 to reflective LCD 220, reducing a radiation pattern reflected by reflective LCD 220, and projecting the reduced radiation pattern onto substrate 240. Projection system 230 may include an imaging lens disposed between reflective LCD 220 and substrate 240, a condenser lens disposed between radiation source 210 and reflective LCD 220, and filters disposed between radiation source 210 and the condenser lens and the projection lens and reflective LCD 220. The projection system may also include a relay system comprising an arrangement of lenses, light pipes, mirrors, and other such devices as are well known in the art.

An imaging lens reduction factor is determined by several factors, such as the minimum size of a feature which is to be patterned on a substrate and the size of pixels in the reflective LCD. For a flat panel display application where the minimum substrate feature size is approximately 1 $\mu$m and each pixel in the reflective LCD measures 10 $\mu$m×10 $\mu$m, a reduction factor of approximately 10× is required between the reflective LCD and the substrate such that each pixel in the reflective LCD is equivalent to approximately 1 $\mu$m on the image plane. Similarly, in an integrated circuit application where the minimum substrate feature size is approximately 0.5 $\mu$m and each pixel in the reflective LCD measures 2 $\mu$m×2 $\mu$m, a reduction factor of approximately 4× is required between the reflective LCD and the substrate such that each pixel in the reflective LCD is equivalent to approximately 0.5 $\mu$m on the image plane.

Operational Modes

In projection lithography systems used to manufacture integrated circuit devices, the field size or focal area of the imaging lens is typically much smaller than the total substrate area which will be patterned. As a result, various operational modes must be employed to pattern the entire substrate area.

In a step-and-repeat operational mode, the substrate area to be patterned is broken up into discrete segments which are patterned sequentially by stepping the substrate across the image plane from one segment to the next. The stepping movement is performed by a substrate positioning system and the radiation source is normally pulsed off when the substrate is moving. In fixed mask projection lithography systems, changing masks typically requires a significant amount of overhead time as each new mask must be accurately aligned and secured before a projection lithography tool can be brought back on-line for processing. As a result, manufacturing efficiency dictates that large numbers of substrates are patterned between fixed mask changes, and changing fixed masks between substrates in a job lot, or in the midst of processing a single substrate, is not economically feasible in a production environment.

In a reflective LCD projection lithography system, individual pixels within the reflective LCD may be configured to absorb or reflect incident radiation without changing the physical location or orientation of the reflective LCD with respect to other elements of the projection lithography system. Hence, unlike a fixed mask projection lithography system, a reflective LCD projection lithography system may be readily configured to form different radiation patterns without requiring excessive downtime. Consequently, a reflective LCD projection lithography system may be used to form different radiation patterns on different substrates within a particular manufacturing lot of substrates. For example, in a wafer cassette containing twenty-five wafers, each wafer may be patterned with a different geometric pattern. Initially, the reflective LCD may be electrically configured to generate a first geometric pattern which is used to process the first wafer. After the first wafer is patterned, the reflective LCD may be electrically reconfigured to generate a second geometric pattern which is used to pattern the second wafer. The reflective LCD may be successively reconfigured after each wafer is patterned until each wafer in the job lot has been patterned with a different radiation pattern.

In another embodiment, a reflective LCD projection lithography system utilizing a step-and-repeat method may be used to form different radiation patterns on the same substrate. For example, the reflective LCD may be electrically configured to generate a first geometric pattern which is used to pattern a first portion of a particular substrate. The reflective LCD may then be electrically reconfigured to generate a second geometric pattern which is used to pattern a second portion of the same substrate. The reflective LCD may be reconfigured while the substrate positioning system is stepping the substrate across the image plane and the radiation source is pulsed off. Using such a method, several different prototype integrated circuit design variations could be manufactured simultaneously on the same substrate, thereby reducing product development costs. Alternatively, different sized semiconductor devices could be manufactured on the same substrate in order to minimize unused substrate areas.

Step-and-repeat projection system throughput is limited by the overhead time required for the stepping, settling, and aligning steps which are required for each segment. For large substrate applications such as circuit boards or flat panel displays, a substrate may comprise a single repeating pattern which is imaged on adjacent segments. The edges of adjacent segments may be "stitched" together by the projection lithography system such that several segments form a connected circuit pattern. In such an application, a step-and-repeat system must position segments very precisely in order to join adjacent segment features together, and positioning errors may cause significant yield loss.

Using a reflective LCD projection lithography system, a repeating pattern may be imaged onto a substrate by means of a seamless scanning process. Pixels in a reflective LCD may be continuously reconfigured in order to generate a repeating geometric pattern which "scrolls" across the reflective LCD. A particular geometric pattern may be "scrolled" in one direction across the reflective LCD while a radiation stream from a radiation source is directed onto the reflective LCD, thereby creating a continuously varying reflected radiation pattern. The radiation pattern may be reduced and focused onto a substrate which is moved across the image plane in a direction opposite the movement of the geometric pattern across the reflective LCD. The speed at which the repeating geometric pattern is scrolled across the reflective LCD may be coordinated with the speed at which the substrate is moved across the image plane, such that a repeating radiation pattern is imaged across the substrate. Because the substrate is moved continuously across the image plane, the overhead time required to step, settle, and align the substrate in a typical step-and-repeat system may be eliminated. Additionally, because the movement of the substrate may be substantially seamless with respect to minimum feature size, positioning errors may also be greatly reduced.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

We claim:

1. A method for projecting a plurality of geometrically distinct radiation patterns onto a substrate, the method comprising:
   providing a reflective liquid crystal display comprising an array of configurable pixels, wherein the reflective liquid crystal display comprises at least one lower reflective rear electrode and at least one upper reflective rear electrode;
   forming a first image pattern on the reflective liquid crystal display;
   directing radiation from a radiation source onto the reflective liquid crystal display, thereby generating a first reflected radiation pattern;
   reducing the first reflected radiation pattern;
   projecting the first reflected radiation pattern onto a first portion of the substrate;
   forming a second image pattern on the reflective liquid crystal display;
   directing radiation from a radiation source onto the reflective liquid crystal display, thereby generating a second reflected radiation pattern;
   reducing the second reflected radiation pattern; and
   projecting the second reflected radiation pattern onto a second portion of the substrate.

2. The method of claim 1, wherein the first image pattern represents a portion of a first integrated circuit device and the second image pattern represents a portion of a second integrated circuit device.

3. The method of claim 1, wherein the second image pattern is smaller than the first image pattern.

4. A method for projecting for projecting a repeating radiation pattern onto a substrate, the method comprising the steps of:
   providing a reflective liquid crystal display comprising an array of configurable pixels, wherein the reflective liquid crystal display comprises at least one lower reflective rear electrode and at least one upper reflective rear electrode;
   scrolling a repeating geometric pattern across the reflective liquid crystal display in a first direction;
   providing a radiation source;
   directing radiation from the radiation source onto the reflective liquid crystal display, thereby generating a continuously varying reflected radiation pattern;
   reducing the reflected radiation pattern;
   projecting the reflected radiation pattern onto a substrate while moving the substrate in a direction opposite the first direction, such that a repeating radiation pattern is continuously imaged across the substrate.

5. The method of claim 4, wherein the repeating radiation pattern represents a portion of a electrical circuit on a flat panel display.

6. The method of claim 4, wherein the radiation source is an optical light source, an ultraviolet light source, an excimer laser, an x-ray source, an electron source, or an ion source.

* * * * *